United States Patent [19]
Rostoker et al.

[11] Patent Number: 5,539,174
[45] Date of Patent: Jul. 23, 1996

[54] CLEAN LASER CUTTING OF METAL LINES ON MICROELECTRONIC CIRCUIT SUBSTRATES USING REACTIVE GASES

[75] Inventors: Michael D. Rostoker, Boulder Creek; Nicholas F. Pasch, Pacifica, both of Calif.

[73] Assignee: LSI Logic Corporation, Milpitas, Calif.

[21] Appl. No.: 249,398

[22] Filed: May 26, 1994

[51] Int. Cl.⁶ .................................................. B23K 26/16
[52] U.S. Cl. ............................. 219/121.69; 219/121.84; 29/847
[58] Field of Search ........................... 219/121.2, 121.24, 219/121.41, 121.68, 121.69, 121.72, 121.84, 121.95; 216/13, 65, 63, 94; 156/638.1, 643.1; 134/1, 1.3; 29/847

[56] References Cited

U.S. PATENT DOCUMENTS

| | | | |
|---|---|---|---|
| 3,360,398 | 12/1967 | Garibotti | 219/121.69 |
| 3,866,398 | 2/1975 | Vernon, Jr. et al. | 219/121.69 |
| 4,691,078 | 9/1987 | Nishioka et al. | 29/847 |
| 4,720,620 | 1/1988 | Arima | 219/121.69 |
| 5,334,280 | 8/1994 | Anthony et al. | 216/65 |

FOREIGN PATENT DOCUMENTS

| | | |
|---|---|---|
| 1-225333 | 9/1989 | Japan. |
| 2-257118 | 10/1990 | Japan. |

OTHER PUBLICATIONS

Janal, Meir, "Technologies for Economic Production of ASICs", Mar. 1993 Solid State Technology at pp. 35, 36, 38.

*Primary Examiner*—Teresa J. Walberg
*Assistant Examiner*—Gregory L. Mills
*Attorney, Agent, or Firm*—Poms, Smith, Lande & Rose

[57] ABSTRACT

A laser is used to cut or "zap" unwanted sections of an aluminum interconnect metallization pattern on a microelectronic circuit substrate. Vaporized aluminum forms a cloud above the substrate that is reacted with a gas to form a substance which can be prevented from solidifying and forming a conductive residue on the substrate that could create a short circuit in the metallization pattern. The gas can be pressurized oxygen, in which case the reactant substance is electrically insulative aluminum oxide that forms a desirable sealing coating over the cut area. The aluminum oxide has a lower density than aluminum, and expands in the cut area to form a hermetic seal with the facing edges of the metallization pattern. Alternatively, the gas can be chlorine or other material which forms a residue that can be easily removed using a solvent such as water.

10 Claims, 3 Drawing Sheets

CLEAN LASER CUTTING OF METAL LINES ON MICROELECTRONIC CIRCUIT SUBSTRATES USING REACTIVE GASES

BACKGROUND OF THE INVENTION

1. Field of the Invention

The present invention generally relates to the art of microelectronic circuit fabrication, and more specifically to a method for clean laser cutting of metal lines on microelectronic circuit substrates using reactive gases.

2. Description of the Related Art

Laser cutting or "zapping" is an effective method of programming gate arrays for Application Specific Integrated Circuits (ASIC), and otherwise modifying interconnect metallization patterns on microelectronic integrated circuits. An introduction to laser cutting is presented in an article entitled "Technologies for economic production of ASICs", by Meir Janai, in Solid State Technology, March 1993, pp. 35-38.

Metallization patterns for ASICs and other configurable integrated circuits are formed with "fuse" sections that can be cut to program or configure the chip for a specific application by disconnecting redundant circuitry. ASICs generally include thousands of such fuse sections. Fuse technology is also used for applications such as SRAM development, Field programmable devices (FPGA's, etc.) and circuit encrypttion.

The prior art method of laser cutting or zapping is illustrated in FIGS. 1 to 3. In FIG. 1, a metal interconnect line 10 is formed of an electrically conductive metal on an integrated circuit substrate 12. Where the substrate 12 is silicon, the line 10 is typically formed of aluminum or an alloy thereof.

The line 10 is part of a programmable gate array or other microelectronic circuit structure, and interconnects two logic gates or other circuit elements (not shown) that are to be disconnected in order to configure or program the circuit. An encapsulation or passivation layer 14, preferably of silicon dioxide, is formed over the line 10 in a "tunnel" configuration.

The line 10 is cut by applying an energy beam 16 to the central section thereof as indicated by arrows. An appropriate source of energy is coherent light emitted by a Nd:YAG laser 18. The energy applied by the laser beam 16 vaporizes the central section of the aluminum line 10, thereby cutting the line 10 and providing the desired circuit disconnection.

As illustrated in FIG. 2, the applied energy vaporizes not only the aluminum material of the line 10, but also the overlying silicon dioxide layer 14 and a generally small thickness of the underlying substrate 12. The vaporized material is predominantly aluminum from the line 10, however, and forms a gaseous cloud 20 in and over a space 22 that is created by removal of the central section of the line 10.

After the line 10 is cut, the laser beam 16 is moved to another area of the circuit to cut another line. After this occurs, a portion of the cloud 20 solidifies to form a residue layer 24 in the space 22 as illustrated in FIG. 3.

In the prior art, laser cutting is performed in an ambient of clean air, which comprises oxygen and nitrogen. The residue layer 24 is formed by explosive abulation of the aluminum metal, and comprises splattered aluminum particles having partially oxidized surfaces. These particles are electrically conductive, and can bridge the gap between and electrically interconnect the adjacent ends of the cut line 10.

This defeats the purpose of the laser cutting, since the line that was cut remains conductive after the operation is completed. Although not specifically illustrated, the residue layer 24 can also spread out to undesirably interconnect adjacent lines that were previously not and should not be interconnected.

SUMMARY OF THE INVENTION

It is an object of the present invention to provide a method for clean laser cutting or "zapping" of unwanted conductive members or sections of (aluminum or other conductive material) interconnect metallization patterns on microelectronic circuit substrates.

In accordance with the invention, a conductive member to be removed is cut or "zapped" with a laser beam of sufficient energy to vaporize the aluminum, or other conductive material, which forms a cloud above the cut area. The laser cutting is performed in an ambient gas that reacts with the aluminum, or other conductive material in the cloud to form a substance that can be prevented from solidifying and forming a conductive residue (such as aluminum nitride) on the substrate that could create a short circuit in the metallization pattern.

It is another object of the present invention to provide a microelectronic circuit substrate structure in which unwanted areas of interconnect metallization patterns that were removed by laser cutting are replaced by a desirable sealing coating of an electrically insulative material.

This is accomplished by using oxygen (for aluminum) as the ambient reactive gas, in which case the substance which is formed by reaction is electrically insulative aluminum oxide that solidifies on the cut area of the substrate. The aluminum oxide has a lower density than aluminum, and expands in the cut area to engage with and seal the facing cut edges of the metallization pattern.

Alternatively, the gas can be chlorine or another material that forms a residue which can be easily removed using a solvent such as water.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 4:
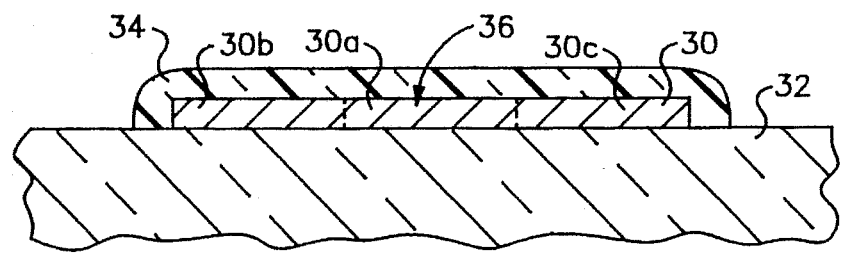
FIGS. 4 to 7 are simplified sectional views illustrating a first method of laser cutting according to the present invention.

A first method of laser cutting or zapping in accordance with the present invention is illustrated in FIGS. 4 to 7. In FIG. 4, a metal interconnect line 30 is formed of an electrically conductive metal on an integrated circuit substrate 32. Where the substrate 32 is silicon, the line 30 is typically formed of aluminum or an alloy thereof. An encapsulation or passivation layer 34, preferably of silicon dioxide, is formed over the line 30 in a "tunnel" configuration.

The line 30 includes a central solid member or section 30a that is disposed in a space 36 between two additional solid members or sections 30b and 30c. In their initial state, the sections 30a, 30b and 30c are electrically connected, and traditionally integral. The sections 30b and 30c are respectively connected to two logic gates or other circuit elements (not shown) that are to be disconnected in order to configure or program an integrated circuit (not shown) of which the line 30 is an element.

Figure 1:
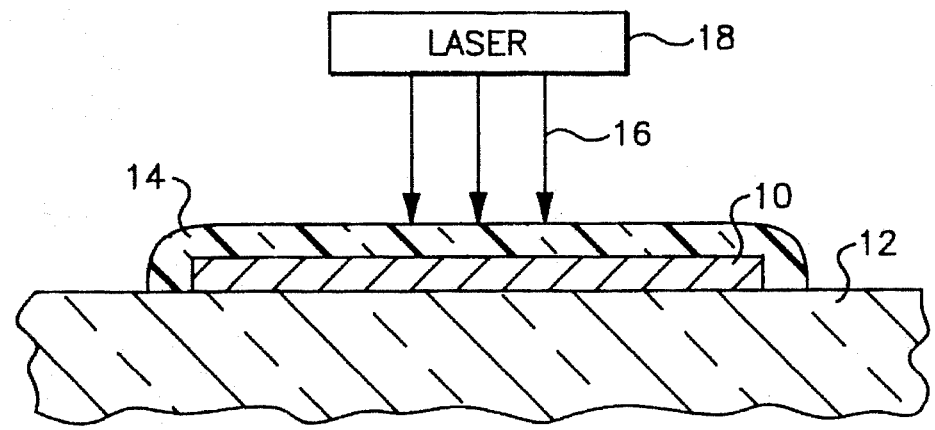
FIGS. 1 to 3 are simplified sectional views illustrating a prior art method of using a laser to cut unwanted conductive members or sections of aluminum interconnect metallization patterns on microelectronic circuit substrates.
Figure 2:
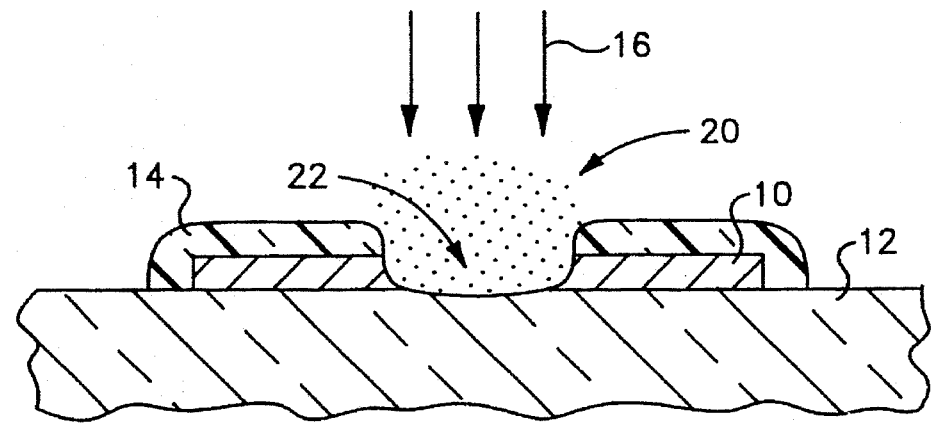
Figure 3:
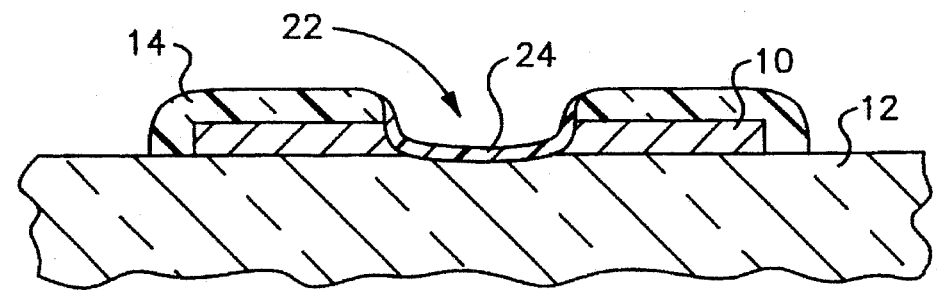
Figure 5:
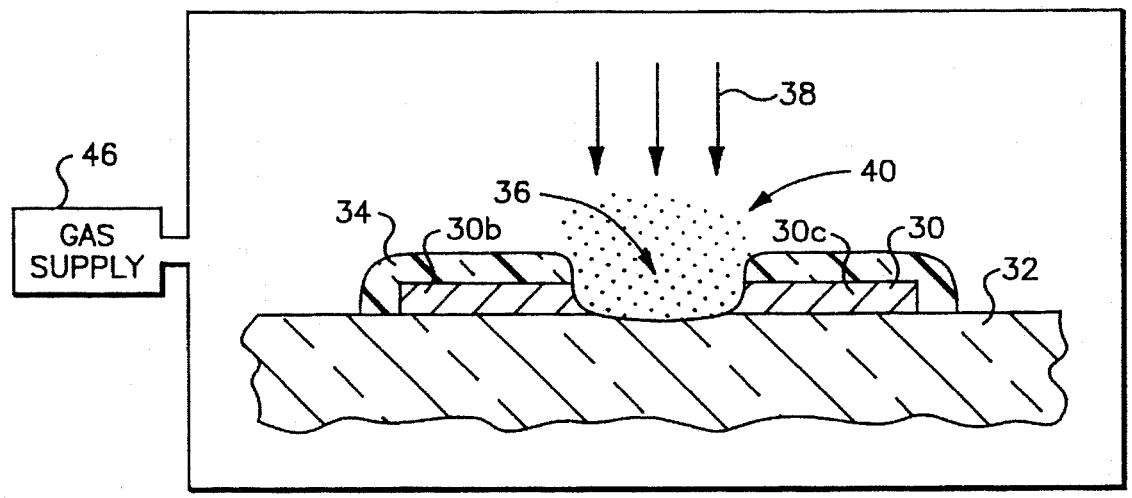
Figure 6:
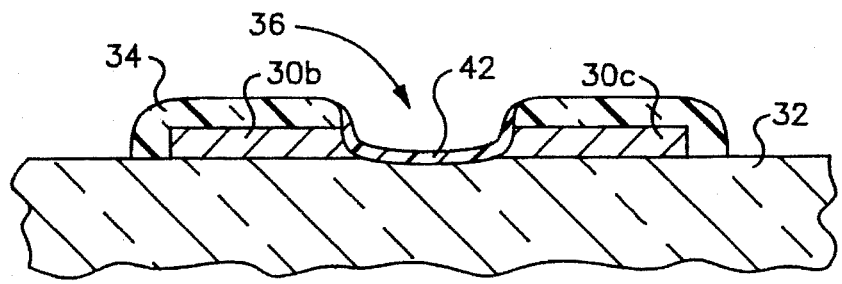

The line 30 is cut as illustrated in FIG. 5 by applying energy to the central section 30a thereof using a beam 38 of coherent light emitted by a Nd:YAG laser as described above with reference to FIG. 1. The energy applied by the laser beam 38 vaporizes the central section 30a of the aluminum line 30, thereby cutting the line 30 and providing the desired circuit disconnection.

The applied energy vaporizes the aluminum material of the line 30, the overlying silicon dioxide layer 34 and often a small thickness of the underlying substrate 32. The vaporized material is predominantly aluminum from the line 30, however, and forms a gaseous cloud 40 in and over the space 36 that has been created by removal of the section 30a of the line 30.

After the line 30 is cut, the laser beam 38 is removed from activity on the area 36, and may then be moved to another area of the circuit to cut another line. After this occurs, a portion of the cloud 40 solidifies to form a residue layer 42 in the space 36.

In accordance with the present invention, the laser cutting is performed in an ambient comprising a gas that reacts with aluminum (or other conductive material). As illustrated in FIG. 5, the substrate 32 may be enclosed in a container 44 that is filled with a suitable gas from a supply 46.

Alternatively, the container 44 can be omitted and the gas supplied from a suitable discharge orifice (not shown) to form a blanket of gas over the substrate 32.

In either case, the gas comprises or contains a material that reacts with the material of the line 30 such that the formation of an electrically conductive residue in the space 36 is eliminated.

More specifically, the gas from the supply 46 that is reacted with the aluminum from the line 30 to form the gaseous cloud 40 is selected such that a third gaseous material thereof that forms the residue layer 42 in the space 36 can be easily removed from the substrate 32 and space 36 using a suitable solvent. The residue layer 42 is preferably electrically insulative, but can be electrically conductive since it is chemically stable and will be removed during subsequent processing.

Figure 7:
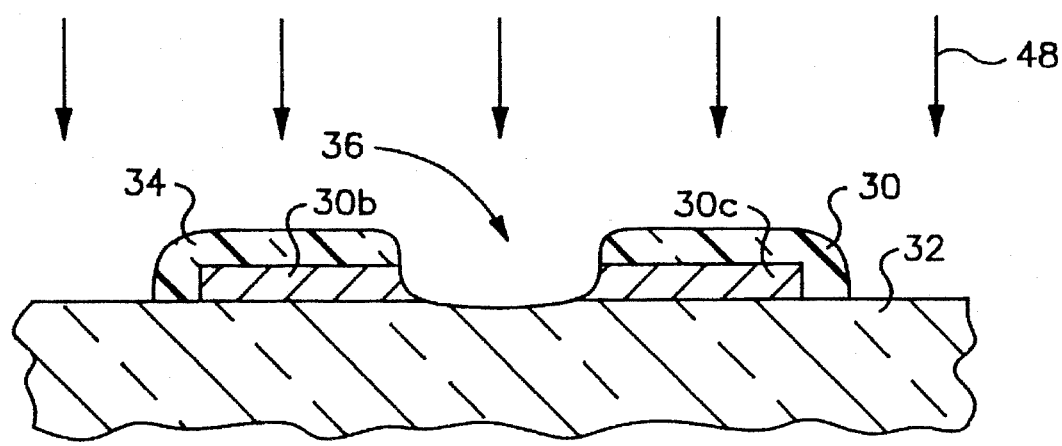

The next step of the process where the residue is removable is illustrated in FIG. 7, in which the substrate 32 is immersed into or rinsed with a solvent that dissolves away the residue layer 42 as indicated by arrows 48. The space 36 between the adjacent ends of the sections 30b and 30c of the line 30 is now clear of residue, and electrical interconnection thereof is positively precluded.

The reactive gas that is supplied into the container 44 for reaction with the aluminum can be, for example: chlorine, bromine or ethanol, all of which react with aluminum to form materials that can be dissolved away using water as the solvent. It is further within the scope of the invention to use methanol as the reactive gas, in which case the residue 42 formed by reaction can be dissolved away using propanol.

Other reactive gasses that can be used to practice the invention include, but are not limited to, fluorine and ammonia. As yet another alternative embodiment of the method of FIGS. 4 to 7, the reactive gas can be selected such that the residue layer 42 is formed of a material that can be removed by mechanical abrasion or other means, rather than being dissolved away using a solvent.

The reactive gas that is supplied into the container 44 need not be pure, but can be diluted with an inert gas or other gas to suitably control the laser cutting and reaction conditions.

For example, laser cutting should be performed at a temperature of less than 330° C. If this temperature is substantially exceeded, the diffusion coefficient of the aluminum becomes so high that the line 30 becomes plastic, and could flow, separate or diffuse into the passivation layer 34. The reactive gas can be diluted with an inert gas such as helium that has high thermal conductivity to increase heat flow away from the cutting area and maintain the temperature below 330° C.

Alternatively, the reactive gas can be diluted with an inert gas such as argon that has low thermal conductivity to decrease the heat flow away from the cutting area. The latter embodiment can enable the cutting to be performed using a lower powered laser by conserving the heat generated by the cutting process. In either case, the concentration of reactive gas in the ambient can range from approximately 10% to 100%.

Figure 8:
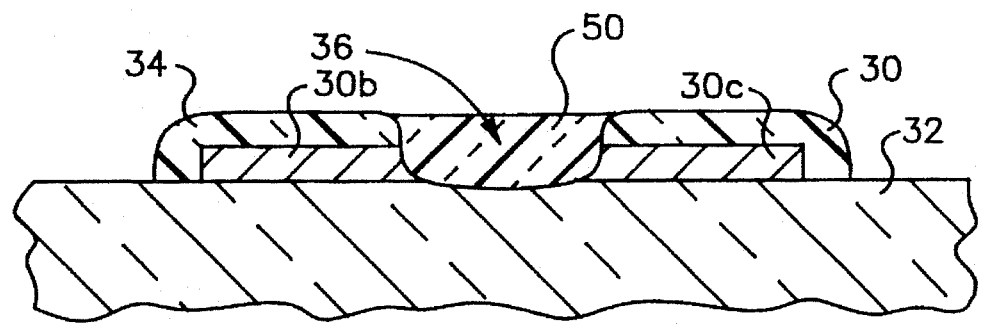
FIGS. 8 and 9 are simplified sectional views illustrating a second method of laser cutting embodying the invention.
Figure 9:
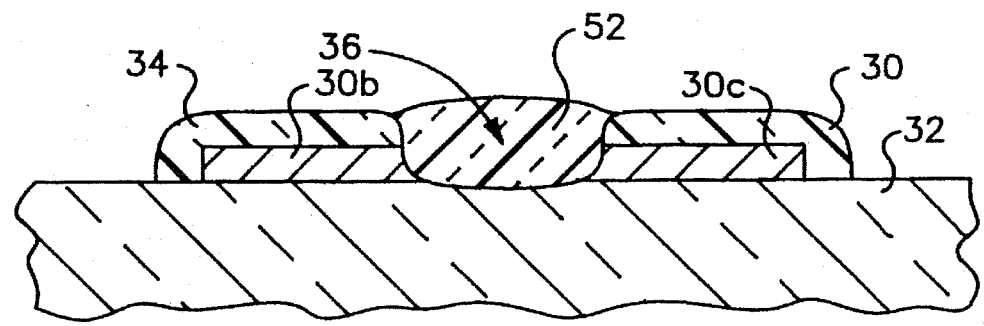

FIGS. 8 and 9 illustrate a second method of clean laser cutting embodying the present invention. The first step of the method is essentially similar to that illustrated in FIG. 5, except that the gas that is supplied into the container 44 is oxygen. The gaseous material that constitutes the cloud 40 is aluminum oxide, which is an electrically insulative material.

As illustrated in FIG. 8, a residue layer 50 of aluminum oxide forms in the space 36 after the laser beam is removed. Aluminum oxide is less dense than aluminum, and expands as it cools. As illustrated in FIG. 9, the layer 50 expands to form a plug 52 that hermetically seals the portion of the substrate 32 at the bottom of the space 36 and sealingly engages with the adjacent cut edges of the sections 30b and 30c of the line 30.

The plug 52 not only provides a gas tight seal for the laser cut area, but also protects the underlying structure from mechanical abrasion and other environmental agents that could cause damage or deterioration. Since the reactive gas does not contain nitrogen, no nitrogen oxide or other electrically conductive material is formed that could adversely affect the laser cut area or adjacent areas.

The concentration of the oxygen gas should necessarily be higher than atmospheric to accelerate the formation of aluminum oxide as much as is practical in a particular application. As with the method of the invention described with reference to FIGS. 4 to 7, the oxygen gas can be diluted with an inert or other gas as appropriate. For example, if oxygen gas is diluted with helium or argon, the oxygen concentration is preferably between 10% and 99%.

Various modifications will become possible for those skilled in the art after receiving the teachings of the present disclosure without departing from the scope thereof.

For example, although the invention has been described and illustrated as being used for laser cutting of metal interconnect lines in microelectronic integrated circuits, the invention is not so limited, and can be applied for removal of a metallic or non-metallic solid member from a substrate or support in applications other than microelectronic circuit fabrication.

We claim:

1. A method of removing an electrically conductive solid member from a substrate, comprising the steps of:
   (a) applying energy to vaporize said solid member and produce a first gaseous material;
   (b) reacting said first gaseous material with a second gaseous material to form a third gaseous material; and
   (c) eliminating formation of an electrically conductive residue of said third gaseous material on the substrate; in which
   steps (b) and (c) are integral, and comprise providing said second gaseous material in step (b) such that said third gaseous material is electrically insulative; the method further comprises the step of:
   (d) removing said energy such that said third gaseous material solidifies on the substrate;
   said solid member is disposed in a space between and electrically interconnects two additional solid members; and
   step (b) comprises providing said second gaseous material such that said third gaseous material has a lower density than said solid member and expands in said space during step (d) into sealing engagement with said two additional solid members.

2. A method as in claim 1, in which step (a) comprises radiating an energy beam onto said solid member.

3. A method as in claim 1, in which step (a) comprises radiating a laser light beam onto said solid member.

4. A method as in claim 1, in which step (b) comprises providing said second gaseous material such that said third gaseous material comprises an electrically insulating oxide.

5. A method as in claim 4, in which:
   said solid member comprises aluminum; and
   step (b) comprises providing said second gaseous material as comprising oxygen at a pressure that is higher than atmospheric pressure.

6. A method as in claim 5 in which step (b) comprises providing said second gaseous material as comprising 10% to 100% oxygen by volume.

7. A method as in claim 5, in which step (b) comprises providing said second gaseous material as a mixture of oxygen and a material selected from the group consisting of argon and helium.

8. A method as in claim 7, in which step (b) comprises providing said second gaseous material as comprising 10% to 99% oxygen by volume.

9. A method of removing an electrically conductive solid member from a substrate, comprising the steps of:
   (a) applying energy to vaporize said solid member and produce a first gaseous material;
   (b) reacting said first gaseous material with a second gaseous material to form a third gaseous material; and
   (c) eliminating formation of an electrically conductive residue of said third gaseous material on the substrate; in which
   the method further comprises the step, performed between steps (b) and (c), of:
   (d) removing said energy such that said third gaseous material forms a residue on the substrate;
   step (c) includes removing said residue from the substrate;
   said solid member comprises aluminum;
   step (b) comprises providing said second gaseous material as including methanol; and
   step (c) comprises applying propanol to dissolve away said residue from the substrate.

10. A method of electrically isolating a microelectronic circuit, comprising the steps of:
    (a) applying energy to vaporize unwanted electrically conductive solid members and produce a first gaseous material;
    (b) reacting said first gaseous material with a second gaseous material to form a third gaseous material; and
    (c) eliminating formation of an electrically conductive residue of said third gaseous material on the substrate; in which
    steps (b) and (c) are integral, and comprise providing said second gaseous material in step (b) such that said third gaseous material is electrically insulative; the method further comprises the step of:
    (d) removing said energy such that said third gaseous material solidifies on the substrate; and
    step (b) comprises providing said second gaseous material such that said third gaseous material has a lower density than said solid members and expands in spaces created by vaporizing said solid members in step (a) to form plugs that hermetically seal said spaces respectively.

* * * * *